US010884304B2

(12) United States Patent
Jian et al.

(10) Patent No.: US 10,884,304 B2
(45) Date of Patent: Jan. 5, 2021

(54) DISPLAY PANEL AND DISPLAY DEVICE

(71) Applicant: Au Optronics Corporation, Hsinchu (TW)

(72) Inventors: Bo-Ru Jian, Hsinchu (TW); Wei-Liang Chan, Hsinchu (TW); Chen-Yi Wu, Taipei (TW); Mei-Hui Lee, Yunlin County (TW); Chi-Hsiung Chang, Hsinchu (TW); Tai-Tso Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/183,733

(22) Filed: Nov. 8, 2018

(65) Prior Publication Data
US 2019/0187523 A1 Jun. 20, 2019

(30) Foreign Application Priority Data

Dec. 19, 2017 (TW) .............................. 106144579 A

(51) Int. Cl.
*G02F 1/1362* (2006.01)
*G02F 1/1368* (2006.01)
(Continued)

(52) U.S. Cl.
CPC ...... *G02F 1/136209* (2013.01); *G02F 1/1368* (2013.01); *G02F 1/133512* (2013.01);
(Continued)

(58) Field of Classification Search
CPC ......... G02F 1/133514; G02F 1/136286; G02F 1/136209; G02F 1/1368;
(Continued)

(56) References Cited

U.S. PATENT DOCUMENTS 6,850,292 B1 * 2/2005 Murade ............. G02F 1/136209
349/44
9,910,327 B2 3/2018 Zhang
(Continued)

FOREIGN PATENT DOCUMENTS

CN 1154012 4/2001
CN 105093654 11/2015
(Continued)

*Primary Examiner* — Jessica M Merlin
(74) *Attorney, Agent, or Firm* — JCIPRNET

(57) ABSTRACT

A display panel includes a first substrate, a second substrate, a display medium layer, pixel units, and a light-shielding conductive pattern layer. The first substrate has a first inner surface and a first outer surface, and the first outer surface serves as a display surface of the display panel. The second substrate is disposed opposite to the first substrate and has a second inner surface and a second outer surface. The display medium layer is disposed between the first inner surface and the second inner surface. The pixel units are disposed between the display medium layer and the first inner surface, and at least one of the pixel units includes an active element. The light-shielding conductive pattern layer is disposed between the display medium layer and the second inner surface, at least partially overlaps the active element in a vertical projection direction, and includes a first patterned light-shielding conductive layer and a first patterned low-reflection layer. The first patterned light-shielding conductive layer is disposed between the first patterned low-reflection layer and the second substrate.

13 Claims, 8 Drawing Sheets

(51) Int. Cl.
*G02F 1/1335* (2006.01)
*H01L 29/786* (2006.01)

(52) U.S. Cl.
CPC .. *G02F 1/133514* (2013.01); *G02F 1/136286* (2013.01); *H01L 29/78633* (2013.01); *G02F 2001/133562* (2013.01); *G02F 2001/136222* (2013.01); *G02F 2201/38* (2013.01)

(58) Field of Classification Search
CPC ..... G02F 2001/136222; G02F 2201/38; G02F 1/133512; H01L 29/78633
See application file for complete search history.

(56) References Cited

U.S. PATENT DOCUMENTS

| | | | |
|---|---|---|---|
| 2009/0051860 A1* | 2/2009 | Hiruma | G02B 5/003 349/106 |
| 2009/0109365 A1* | 4/2009 | Yoo | G02F 1/136213 349/46 |
| 2015/0129985 A1* | 5/2015 | Kim | H01L 29/78633 257/401 |
| 2016/0161798 A1* | 6/2016 | Lee | G02F 1/133528 349/65 |
| 2017/0184931 A1 | 6/2017 | Zhang et al. | |
| 2017/0248827 A1 | 8/2017 | Zhang | |

FOREIGN PATENT DOCUMENTS

| | | |
|---|---|---|
| CN | 108121098 | 6/2018 |
| WO | 2016202060 | 12/2016 |

\* cited by examiner

_US 10,884,304 B2_

DISPLAY PANEL AND DISPLAY DEVICE

CROSS-REFERENCE TO RELATED APPLICATION

This application claims the priority benefit of Taiwan application serial no. 106144579, filed on Dec. 19, 2017. The entirety of the above-mentioned patent application is hereby incorporated by reference herein and made a part of this specification.

TECHNICAL FIELD

The disclosure relates to a display panel and a display device; more particularly, the disclosure relates to a display panel and a display device that can be used while strong outdoor ambient light (e.g., sunlight) is provided.

RELATED ART

With the advancement of electronic technologies, the frequency of using display devices in an outdoor environment is increasing. The conventional display devices are prone to the problem of display errors after long-term exposure to the strong outdoor ambient light (e.g., sunlight). As such, how to solve said problem has become a subject of research at present.

SUMMARY

The disclosure provides a display panel and a display device that can be used for a long time on the condition of the strong outdoor ambient light (e.g., sunlight) and can still have favorable reliability.

In an embodiment of the disclosure, a display panel includes a first substrate, a second substrate, a display medium layer, a plurality of pixel units, and a light-shielding conductive pattern layer. The first substrate has a first inner surface and a first outer surface, and the first outer surface serves as a display surface of the display panel. The second substrate is disposed opposite to the first substrate and has a second inner surface and a second outer surface. The display medium layer is disposed between the first inner surface and the second inner surface. The pixel units are disposed between the display medium layer and the first inner surface. At least one of the pixel units includes at least one active element and at least one pixel electrode, and the at least one pixel electrode is electrically connected to the at least one active element. The light-shielding conductive pattern layer is disposed between the display medium layer and the second inner surface and at least partially overlaps the active elements in a vertical projection direction, wherein the light-shielding conductive pattern layer includes a first patterned light-shielding conductive layer and a first patterned low-reflection layer, and the first patterned light-shielding conductive layer is disposed between the first patterned low-reflection layer and the second substrate.

In an embodiment of the disclosure, a display device including the aforesaid display panel and a backlight module is provided. The backlight module is located on one side of the display panel.

As described above, in the display panel provided in one or more embodiments of the disclosure, the first substrate has the first inner surface and the first outer surface as the display surface of the display panel, the second substrate disposed opposite to the first substrate has the second outer surface and the second inner surface, the display medium layer is located between the first inner surface and the second inner surface, the light-shielding conductive pattern layer is disposed between the display medium layer and the second inner surface, at least one pixel unit is disposed between the display medium layer and the first inner surface and includes at least one active element, the light-shielding conductive patterned layer and the at least one active element are at least partially overlapped in the vertical projection direction, and the light-shielding conductive pattern layer includes the first patterned low-reflection layer and the first patterned light-shielding conductive layer that is located between the first patterned low-reflection layer and the second substrate. Thereby, when the display device including the display panel is used on the condition of the strong outdoor ambient light (e.g., sunlight), the light-shielding conductive pattern layer may shield the light emitted by the backlight module and may prevent the reflection of the strong ambient light (e.g., sunlight) entering from the display surface. Accordingly, the active elements may be protected from being directly irradiated by the light emitted from the backlight module and being irradiated by the reflected strong ambient light (e.g., sunlight). As such, the display device provided herein can be used for a long time on the condition of the strong outdoor ambient light (e.g., sunlight) and can still have favorable reliability.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein

DESCRIPTION OF THE EMBODIMENTS

Figure 1:
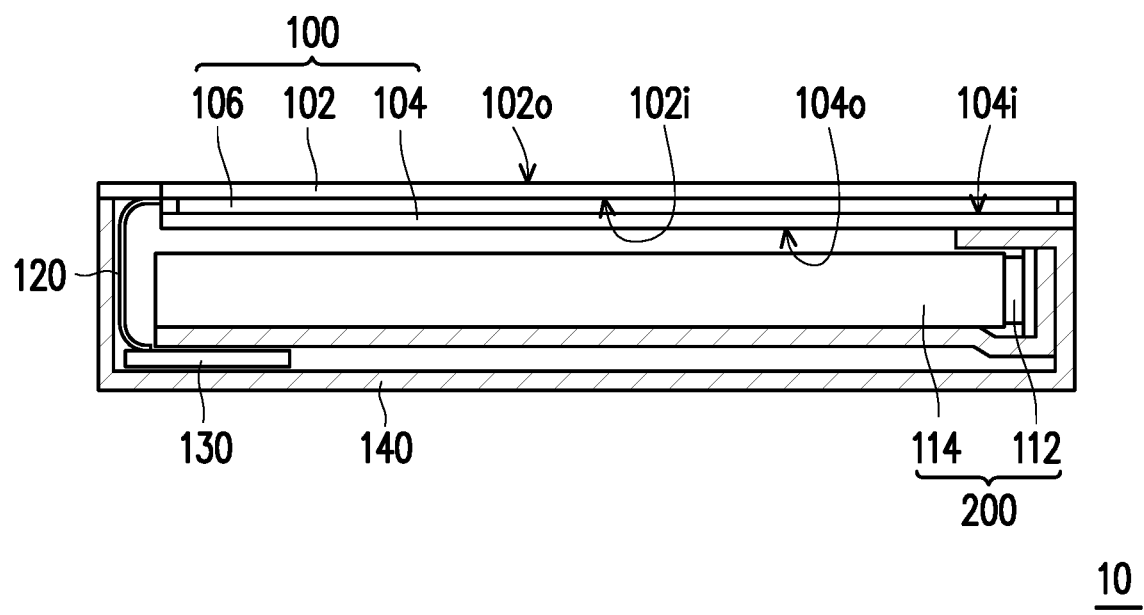
FIG. 1 is a schematic cross-sectional view of a display device according to an embodiment of the disclosure.

Various embodiments of the disclosure are disclosed in the drawings, and for the sake of clarity, many of the practical details are set forth in the following description. However, it should be understood that these practical details should not be used to limit the disclosure. In other words, these practical details are not necessary in some of the embodiments of the disclosure. In addition, to simplify the drawings, some conventional structures and elements in the drawings will be shown in a simple and schematic manner.

The term "about," "approximately," "essentially" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about," "approximately," "essentially" or "substantially" as used herein based on optical properties, etching properties or other properties, instead of applying one standard deviation across all the properties.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected (or coupled). Therefore, the electrical connection (or coupling) between two devices may include intervening elements existing between the two devices.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

In the disclosure, to facilitate understanding, positions of a source and a drain in a transistor in the drawings are exemplary and not intended to be limiting. The reason is that the source and the drain in the transistor may change with current direction, or may differ depending on whether the transistor is an N-type transistor or a P-type transistor.

Figure 2:
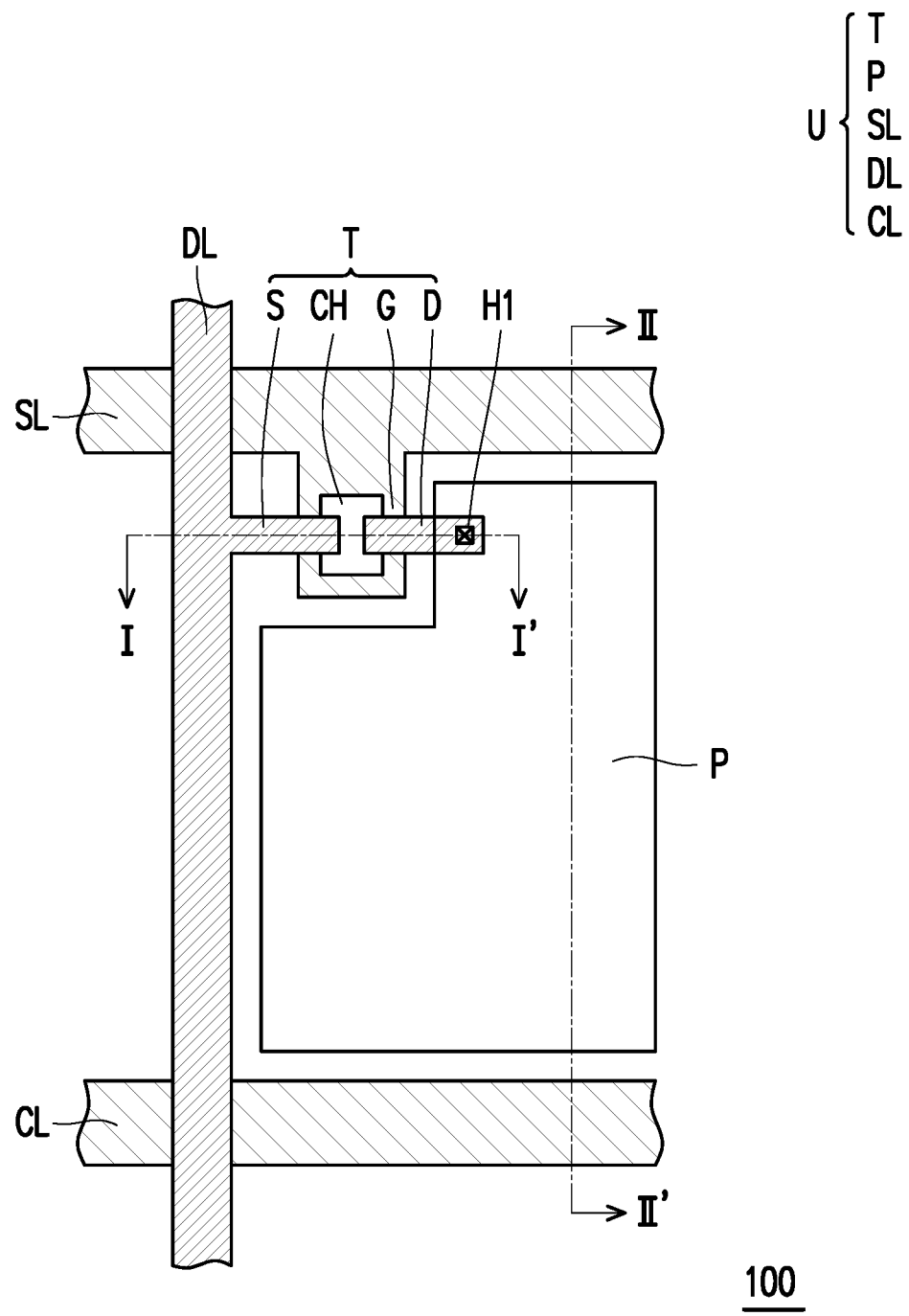
FIG. 2 is a top view of a portion of the display panel depicted in FIG. 1.
Figure 3:
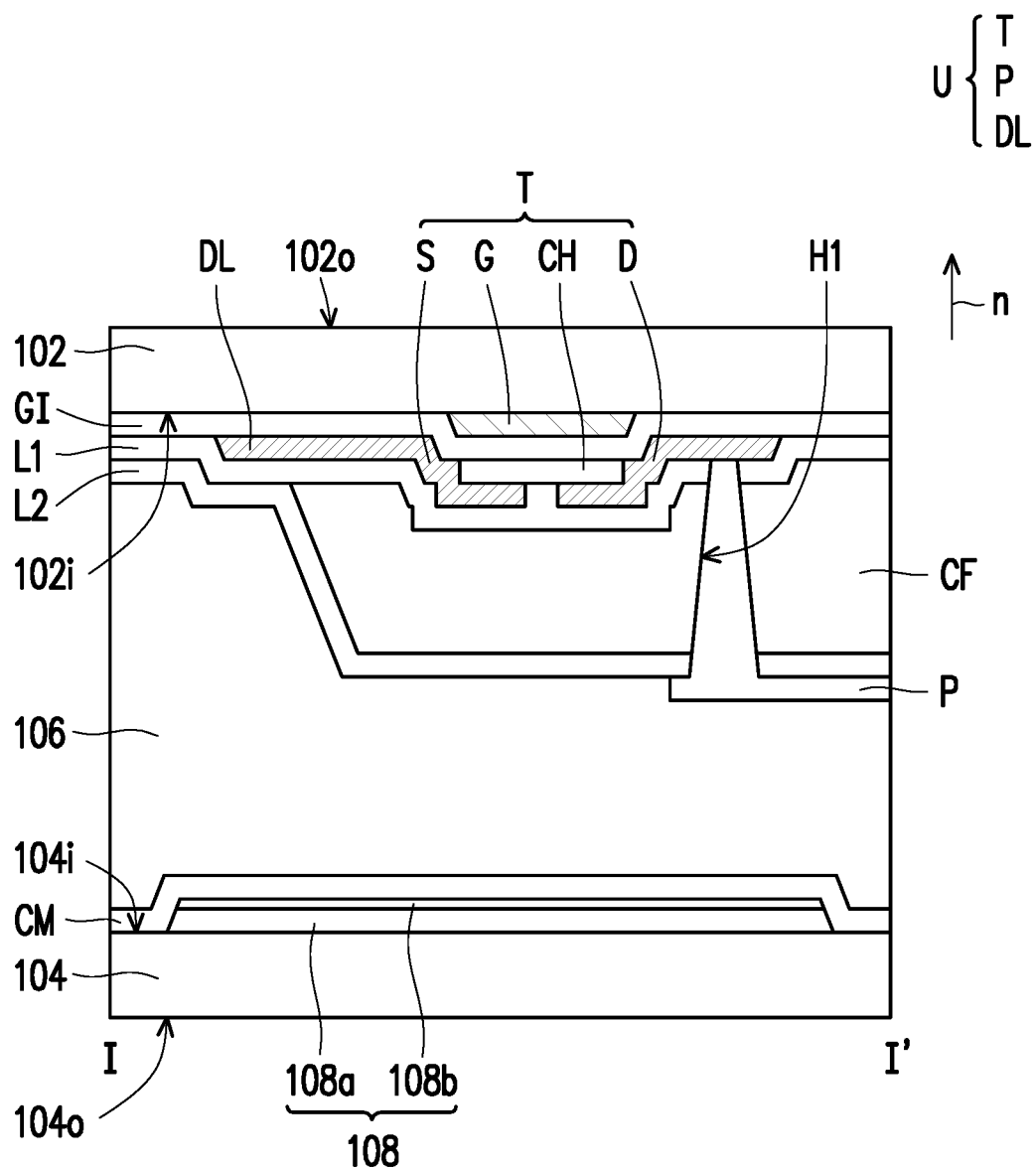
FIG. 3 is a schematic cross-sectional view taken along a section line I-I' depicted in FIG. 2.
Figure 4:
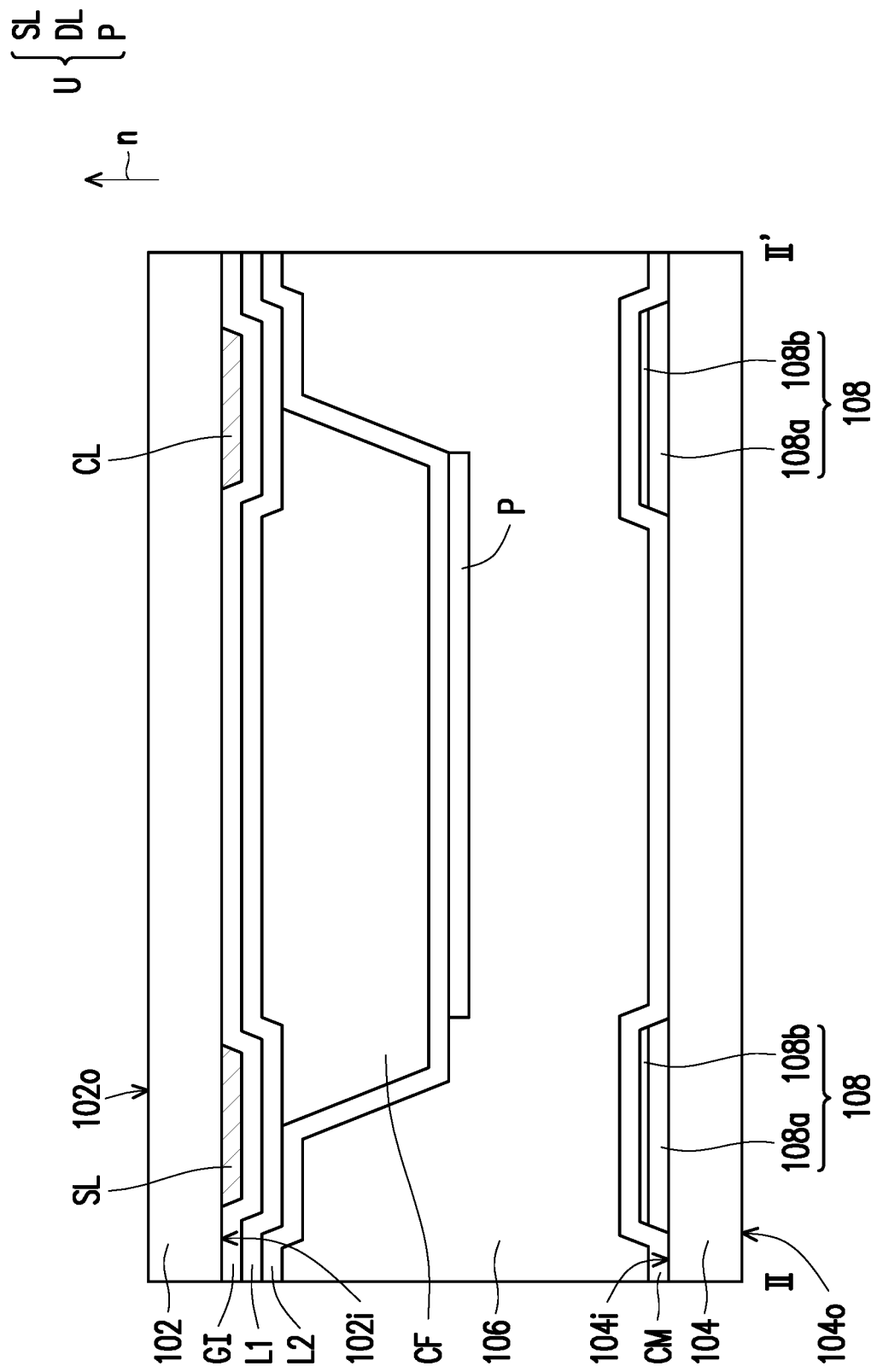
FIG. 4 is a schematic cross-sectional view taken along section line II-II' in FIG. 2.

FIG. 1 is a schematic cross-sectional view of a display device according to an embodiment of the disclosure. FIG. 2 is a top view of a portion of the display panel depicted in FIG. 1. FIG. 3 is a schematic cross-sectional view taken along a section line I-I' depicted in FIG. 2. FIG. 4 is a schematic cross-sectional view taken along section line II-II' in FIG. 2. With reference to FIG. 1 and FIG. 2, FIG. 2 is illustrated at a viewing angle from the second substrate 104 toward the first substrate 102.

As shown in FIG. 1, the display device 10 at least includes the display panel 100, but is not limited thereto. In some embodiments, the display device 10 may optionally include a backlight module 110, but the disclosure is not limited thereto. Besides, the display device 10 may selectively include a flexible circuit board 120, a circuit board 130, and a housing 140, but the disclosure is not limited thereto.

With reference to FIG. 1 to FIG. 4, the display panel 100 at least includes a first substrate 102, a second substrate 104, a display medium layer 106, a plurality of pixel units U, and a light-shielding conductive pattern layer 108. The display panel 100 may further include at least two of a common electrode layer CM, a color conversion layer CF, a gate insulation layer GI, an insulation layer L1, and an insulation layer L2. Note that only one single pixel unit U is depicted in FIG. 2; however, people skilled in the pertinent art should be able to understand that the display panel 100 actually includes a plurality of pixel units U arranged in an array. Nevertheless, the disclosure should not be construed as limited to the embodiments set herein. In other embodiments, the display panel 100 may include at least one pixel unit U and a plurality of other pixel units different from the pixel unit U, or a single pixel unit U includes two display regions (e.g., where two pixel electrodes P are located). In order to clearly illustrate the arrangement of the components in the display device 10, the pixel units U, the light-shielding conductive pattern layer 108, the common electrode layer CM, the color conversion layer CF, the gate insulation layer GI, the insulation layer L1, and the insulation layer L2 in the display panel 100 are omitted in FIG. 1. On the other hand, for illustrative purposes, the second substrate 104, the display medium layer 106, the light-shielding conductive pattern layer 108, the common electrode layer CM, the color conversion layer CF, the gate insulation layer GI, the insulation layer L1, and the insulation layer L2 are omitted in FIG. 2.

In the present embodiment, the first substrate 102 has a first outer surface 102$o$ and a first inner surface 102$i$. According to the embodiment, the first outer surface 102$o$ may serve as the display surface of the display panel 100, and the first outer surface 102$o$ may be the surface closest to the user in the display panel 100. Besides, the material of the first substrate 102 may be transparent or at least translucent, such as glass, plastic, or other suitable materials, but the disclosure is not limited thereto. If the material of the first substrate 102 includes the aforesaid material as well as opaque materials, e.g., metal, alloy, or other suitable materials, the thickness of the opaque materials may still allow the first substrate 102 to be transparent or at least translucent, wherein the thickness of the opaque materials is less than 60 angstroms, for instance, but the disclosure is not limited thereto.

In the present embodiment, the second substrate 104 is disposed opposite to the first substrate 102 and has a second inner surface 104$i$ and a second outer surface 104$o$. Compared to the first substrate 102, the second substrate 104 is farther away from the user according to the present embodiment. If the display device 10 includes the backlight module 110, the second substrate 104 may be closer to the backlight module 110, and the second outer surface 104$o$ may be the surface closest to the backlight module 110 in the display panel 100. Besides, a material of the second substrate 104 may be glass, plastic, or other suitable materials, but the disclosure is not limited thereto. If the material of the second substrate 104 includes the aforesaid material as well as opaque materials, e.g., metal, alloy, or other suitable materials, the thickness of the opaque materials may still allow the second substrate 104 to be transparent or at least translucent, wherein the thickness of the opaque materials is less than 60 angstroms, for instance, but the disclosure is not limited thereto.

In the present embodiment, the display medium layer 106 is disposed between the first inner surface 102$i$ and the second inner surface 104$i$. The display medium layer 106 provided in the present embodiment may be a liquid crystal layer. Nevertheless, the disclosure should not be construed as limited to the embodiments set forth herein. In other embodiments, the display medium layer 106 may also be made of other non-self-luminescent materials (such as an electrophoretic layer, an electrowetting layer, or other suitable materials). According to other embodiments, the display medium layer 106 may also be made of self-luminescent materials (such as an organic light-emitting layer, an inorganic light-emitting layer, or other suitable materials). In this case, the display device 10 may selectively not be equipped with the backlight module 110.

In the present embodiment, the pixel unit U is disposed between the display medium layer 106 and the first inner surface 102i. For instance, the pixel unit U at least includes an active element T and a pixel electrode P. According to the present embodiment, the pixel unit U may further include at least two signal lines, which are exemplified as a scan line SL, a data line DL, a common line CL, or other suitable lines (for example, a power supply line or other suitable lines).

The scan line SL and the data line DL referred to as the signal lines provided in the present embodiment are disposed between the display medium layer 106 and the first inner surface 102i. An extension direction of said scan line SL is different from an extension direction of said data line DL; preferably, the extension direction of said scan line SL intersects (e.g., is substantially perpendicular to) the extension direction of said data line DL. Besides, said scan line SL and said data line DL may be located at different film layers, and the gate insulation layer GI is sandwiched between said scan line SL and said data line DL, which will be elaborated hereinafter. In consideration of conductivity, said scan line SL and said data line DL are often made of metal. However, the disclosure is not limited thereto. According to other embodiments, said scan line SL and said data line DL may also be made of alloy, a nitride of the aforesaid materials, an oxide of the aforesaid materials, an oxynitride of the aforesaid materials, a transparent conductive material, other non-metallic but conductive materials, or any other suitable material, for instance.

In the present embodiment, the active element T is disposed between the display medium layer 106 and the first inner surface 102i and electrically connected to the signal lines (e.g., the scan line SL and the data line DL). For instance, the active element T at least includes a gate electrode G, a channel layer CH, a source electrode S, and a drain electrode D. The gate electrode G is electrically connected to said scan line SL, and the vertical projection of the channel layer CH may be completely located within the vertical projection of the gate electrode G, for instance; however, the disclosure is not limited thereto. The source electrode S and the drain electrode D are electrically connected to two ends of the channel layer CH, respectively, and the source electrode S is electrically connected to said data line DL. From another perspective, in the present embodiment, in terms of the viewing angle from the second substrate 104 toward the first substrate 102, the active element T is a bottom-gate thin film transistor (TFT), which should not be construed as a limitation in the disclosure. In other embodiments, the active element T may also be a top-gate TFT, a three-dimensional TFT, or any other suitable TFT.

According to the present embodiment, the gate electrode G and said scan line SL may be a continuous conductive pattern. For instance, the gate electrode G and said scan line SL are substantially made of the same material. The source electrode S and said data line DL may be a continuous conductive pattern. For instance, the source electrode S and said data line DL are substantially made of the same material, and the drain electrode D and the source electrode S may be substantially made of the same material. However, the disclosure is not limited thereto. In the present embodiment, the gate electrode G and said scan line SL may belong to the same film layer, and the source electrode S, the drain electrode D, and said data line DL may belong to the same layer. However, the disclosure is not limited thereto. According to the present embodiment, the material of the channel layer CH includes, for example, amorphous silicon, nanocrystalline silicon, microcrystalline silicon, polysilicon, monocrystalline silicon, carbon nanotubes/nanorods, oxide semiconductor materials (e.g., indium-gallium-zinc oxide (IGZO), zinc oxide (ZnO), tin oxide (SnO), indium-zinc oxide (IZO), gallium-zinc oxide (GZO), zinc-tin oxide (ZTO), indium-tin oxide (ITO), or other suitable materials), an organic semiconductor material, other suitable materials, or a combination or stack of at least two of the foregoing materials.

In the present embodiment, the gate insulation layer GI may be formed on the entire first substrate 102 and disposed between the gate G and the channel layer CH. The gate insulation layer GI may be of a single-layer structure or a multi-layer structure and may be made of an inorganic material (e.g., silicon oxide, silicon nitride, silicon oxynitride, or other suitable materials), an organic material, or any other suitable material.

The insulation layer L1 provided in the present embodiment may be formed on the entire first substrate 102 and may cover the active element T to provide insulation and protection. The insulation layer L1 may be of a single-layer structure or a multi-layer structure and may be made of an inorganic material (e.g., silicon oxide, silicon nitride, silicon oxynitride, or other suitable materials), an organic material, or any other suitable material. In other embodiments, the display panel 100 may optionally not include the insulation layer L1.

According to the present embodiment, the pixel electrode P is electrically connected to the active element T. The pixel electrode P provided in the present embodiment may be electrically connected to the drain D through a contact window H1 formed in the insulation layer L1, the color conversion layer CF (described in detail below), and the insulation layer L2 (described in detail below); however, the disclosure is not limited thereto. According to the present embodiment, the material of the pixel electrode P may be a transparent conductive material, (e.g., ITO, IZO, aluminum tin oxide (ATO), aluminum zinc oxide (AZO), IGZO, metal or alloy of less than 60 angstroms, other suitable oxides, or a stacked layer of at least two of the aforesaid materials), other suitable materials, or a combination/stack of at least two of the aforesaid materials.

In the present embodiment, the common line CL referred to as the signal line may be disposed between the display medium layer 106 and the first inner surface 102i. According to the present embodiment, said common line CL is substantially parallel to said scan line SL, which should however not be construed as a limitation in the disclosure. In other embodiments, said common line CL may be substantially parallel to other lines in different directions; alternatively, said common line CL may not exist. Said common line CL provided in the present embodiment partially overlaps the pixel electrode P in the vertical projection direction n, so as to form a storage capacitor (Cst, not shown in the drawings) through coupling. However, the disclosure is not limited thereto. In other embodiments, the storage capacitor (Cst, not shown in the drawings) may also be formed by partially overlapping the pixel electrode P and said scan line SL in the vertical projection direction n, or the storage capacitor (Cst, not shown in the drawings) may also be formed in the manner described in the disclosure. Besides, in the present embodiment, said common line CL and said scan line SL may belong to the same film layer, and said common line CL and said data line DL may not belong to the same layer. However, the disclosure is not limited thereto.

In the present embodiment, the color conversion layer CF is disposed between the display medium layer 106 and the first inner surface 102i. According to the present embodiment, the color conversion layer CF includes color filter patterns, for instance, and the color filter patterns may be red, green, or blue filter patterns; however, the disclosure is not limited thereto. In other embodiments, the color conversion layer CF may be disposed between the display medium layer 106 and the second inner surface 104i or between the first inner surface 102i and the active element T. The material of the color conversion layer CF provided in other embodiments may include quantum dots/rods, mixture of color filter patterns and quantum dots/rods, other suitable materials, or a combination or a stacked layer of at least two of the aforesaid materials.

The insulation layer L2 provided in the present embodiment may be formed on the entire first substrate 102 and may cover the color conversion layer CF to provide protection. The insulation layer L2 may be of a single-layer structure or a multi-layer structure and may be made of an inorganic material (e.g., silicon oxide, silicon nitride, silicon oxynitride, or other suitable materials), an organic material, or any other suitable material. In other embodiments, the display panel 100 may optionally not include the insulation layer L2.

In the present embodiment, the light-shielding conductive pattern layer 108 is disposed between the display medium layer 106 and the second inner surface 104i. The light-shielding conductive pattern layer 108 is disposed opposite to elements associated with the pixel unit U.

In the present embodiment, as shown in FIG. 3, the light-shielding conductive pattern layer 108 and the active element T are at least partially overlapped in the vertical projection direction n. For instance, the vertical projection of the active element T may be completely located within the vertical projection of the light-shielding conductive pattern layer 108. Nevertheless, the disclosure should not be construed as limited to the embodiments set forth herein. In other embodiments, as long as the light-shielding conductive pattern layer 108 covers the channel layer CH of the active element T, the light-shielding conductive pattern layer 108 and the active element T may be partially overlapped in the vertical projection direction n.

As shown in FIG. 3 and FIG. 4, the light-shielding conductive pattern layer 108 and the signal lines (e.g., the scan line SL and the data line DL, or the scan line SL, the data line DL and the common line CL) are at least partially overlapped in the vertical projection direction n. For instance, the vertical projection of the signal lines (e.g., the scan line SL and the data line DL, or the scan line SL, the data line DL and the common line CL) may be completely located within the vertical projection of the light-shielding conductive pattern layer 108. Nevertheless, the disclosure should not be construed as limited to the embodiments set forth herein. In other embodiments, the light-shielding conductive pattern layer 108 and the signal lines (e.g., the scan line SL and the data line DL, or the scan line SL, the data line DL and the common line CL) may be partially overlapped in the vertical projection direction n.

The light-shielding conductive pattern layer 108 provided in the present embodiment may include a first patterned light-shielding conductive layer 108a and a first patterned low-reflection layer 108b, and the first patterned light-shielding conductive layer 108a is disposed between the first patterned low-reflection layer 108b and the second inner surface 104i of the second substrate 104. For instance, in the present embodiment, the first patterned light-shielding conductive layer 108a and the first patterned low-reflection layer 108b are sequentially stacked on the second inner surface 104i of the second substrate 104.

The first patterned light-shielding conductive layer 108a provided in the embodiment may be of a single-layer structure or a multi-layer structure, and the material thereof includes (but is not limited to): aluminum, molybdenum, copper, silver, aluminum neodymium alloy, molybdenum titanium alloy, molybdenum tungsten alloy, copper oxide, molybdenum oxide, or other suitable appropriate materials capable of shielding light and conducting electricity. The first patterned low-reflection layer 108b provided in the embodiment may be of a single-layer structure or a multi-layer structure, and the material thereof includes (but is not limited to): aluminum oxide, chromium oxide, copper oxide, molybdenum oxide, aluminum nitride, chromium nitride, copper nitride, molybdenum nitride, molybdenum tantalum alloy oxide, molybdenum titanium alloy oxide, molybdenum tantalum alloy nitride, molybdenum titanium alloy nitride, other suitable material with low-reflection, or other appropriate materials with low-reflection and conductivity. In the present embodiment, preferably, the reflectivity of the first patterned low-reflection layer 108b may be from about 2% to about 20%, but the disclosure is not limited thereto. The thickness of the first patterned light-shielding conductive layer 108a provided in the embodiment may be from about 50 angstroms (Å) to about 10,000 Å, and the thickness of the first patterned low-reflection layer 108b provided in the embodiment may be about 50 Å to about 600 Å; however, the disclosure is not limited thereto.

Besides, in the present embodiment, preferably, the optical density (unitless) of the light-shielding conductive pattern layer 108 is from about 5 to about 6.5, and thus the light-shielding conductive pattern layer 108 may have better light-shielding capability. However, the disclosure is not limited thereto.

The difference between the optical density of the light-shielding conductive pattern layer 108 and the optical density of a conventional black matrix is described below with reference to Table 1. Here, under the same measurement conditions, the thickness of the conventional black matrix is about 1 micrometer (μm), and the thicknesses of the first patterned light-shielding conductive layer 108a and the first patterned low-reflection layer 108b in the light-shielding conductive pattern layer 108 are about 3300 Å and about 400 Å, respectively. Besides, for the light-shielding conductive pattern layer 108, the measurement light (for example, visible light) enters from the side of the first patterned light-shielding conductive layer 108a and the side of the first patterned low-reflection layer 108b, respectively, so as to measure the optical density twice.

TABLE 1

| | The light-shielding conductive pattern layer 108 | | |
|---|---|---|---|
| | Conventional black matrix | The side of the first patterned light-shielding conductive layer 108a | The side of the first patterned low-reflection layer 108b |
| Optical density | 3.8 | 5.5 | 5.8 |

As can be seen from Table 1, when the light-shielding conductive pattern layer 108 and the conventional black matrix have similar thicknesses, the light-shielding conductive pattern layer 108 has a significantly higher optical density, and thus the light-shielding conductive pattern layer 108 has a better light-shielding capability.

The common electrode layer CM provided in the present embodiment may be selectively disposed on the second inner surface 104i of the second substrate 104 and may cover the light-shielding conductive pattern layer 108, and the common electrode layer CM is also disposed opposite to elements associated with the pixel unit U; however, the disclosure is not limited thereto. In other embodiments, the common electrode layer CM may not be disposed on the second inner surface 104i of the second substrate 104 according to design requirements, the way to drive electric fields, and so on. As exemplarily shown in FIG. 3 and FIG. 4, the common electrode layer CM provided in the present embodiment may be in contact with a portion of the first patterned light-shielding conductive layer 108a. As described above, since the material of the first patterned light-shielding conductive layer 108a includes the conductive material, the resistance of the common electrode layer CM may be reduced by the contact of a portion of the first patterned light-shielding conductive layer 108a and the common electrode layer CM. As such, the common voltage of the common electrode layer CM may be evenly transmitted.

In the embodiment, the backlight module 110 may be selectively disposed on one side of the display panel 100. For instance, as shown in FIG. 1, the backlight module 110 may be used for providing the second substrate 104 with light that sequentially passes through the second substrate 104, the display medium layer 106 and the first substrate 102, and the light is emitted from the first outer surface 102o (i.e., the display surface) of the first substrate 102. In the present embodiment, the backlight module 110 may provide high brightness, for example, from about $7.5 \times 10^4$ nits to about $15 \times 10^4$ nits. As such, the display device 10 provided herein is used for a long time on the condition of the strong outdoor ambient light (e.g., sunlight). The reason lies in that a high-brightness display device allows the user to see the displayed image on the condition of the strong outdoor ambient light (e.g., sunlight). In addition, the backlight module 110 provided in the present embodiment may adopt an edge type design. Here, the backlight module 110 may include a light source 112, a light guide plate 114, or other suitable devices. Nevertheless, the disclosure should not be construed as limited to the embodiments set forth herein. In other embodiments, the backlight module 110 may also adopt a direct-type design and may be equipped with optical devices adapted to such design.

In the present embodiment, the flexible circuit board 120 is attached to the first substrate 102 for connecting the circuits on the first substrate 102 and the second substrate 104 to the circuit board 130. The housing 140 may be configured to hold the display device 10 according to the present embodiment.

As described above, in this embodiment, the light-shielding conductive pattern layer 108 is disposed between the display medium layer 106 and the second inner surface 104i, at least partially overlaps the active element T in the vertical projection direction n, and includes the first patterned low-reflection layer 108b and the first patterned light-shielding conductive layer 108a located between the first patterned low-reflection layer 108b and the second substrate 104. Thereby, when the display device 10 is used on the condition of the strong outdoor ambient light (for example, sunlight), the light-shielding conductive pattern layer 108 may completely shield the light emitted by the backlight module 110, so that the active element T at least partially overlapping the light-shielding conductive pattern layer 108 may be prevented from being directly irradiated by the light emitted by the backlight module 110, and the first patterned low-reflection layer 108b in the light-shielding conductive pattern layer 108 may prevent the ambient light (e.g., sunlight) incident from the display surface from being reflected, so that the active element T at least partially overlapping the light-shielding conductive pattern layer 108 may be protected from being irradiated by reflected light of the ambient light (for example, sunlight). In conclusion, the display device 10 can be used for a long time on the condition of the strong outdoor ambient light (e.g., sunlight) and can still have favorable reliability.

In addition, in the embodiments depicted in FIG. 1-FIG. 4, the pixel unit U includes one active element T and one pixel electrode P, but the disclosure is not limited thereto. As long as the pixel unit U includes at least one active element T and at least one pixel electrode P, the pixel unit U falls within the scope of protection provided in the disclosure.

According to the embodiments shown in FIG. 1-FIG. 4, the display device 10 is not equipped with any black matrix, but the disclosure is not limited thereto. In other embodiments, the display device 10 may selectively have a black matrix on the first substrate 102 or the second substrate 104, which may enhance the light-shielding performance of the pixel unit U.

Figure 5:
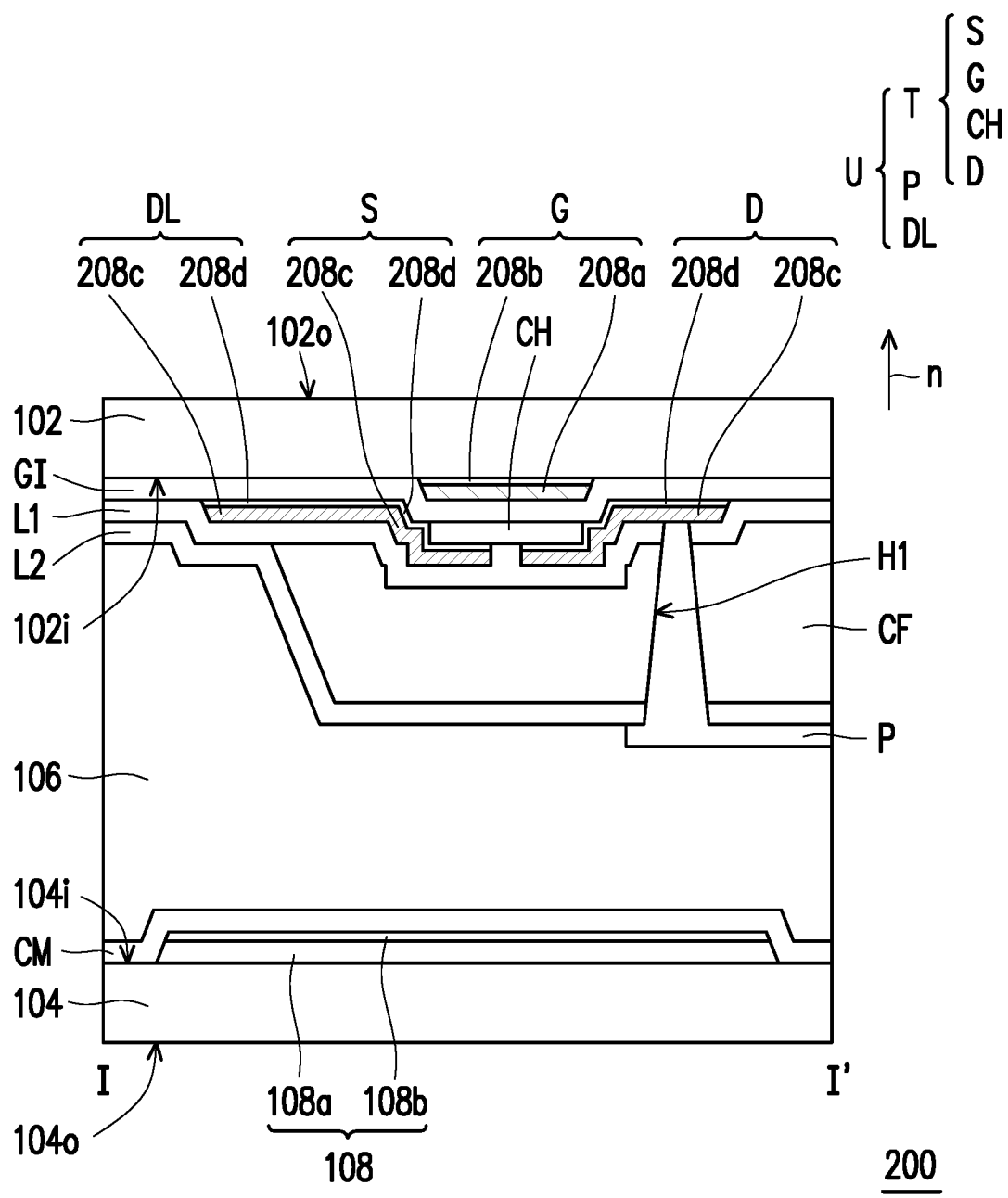
FIG. 5 is a schematic cross-sectional view of a portion of a display panel according to another embodiment of the disclosure.
Figure 6:
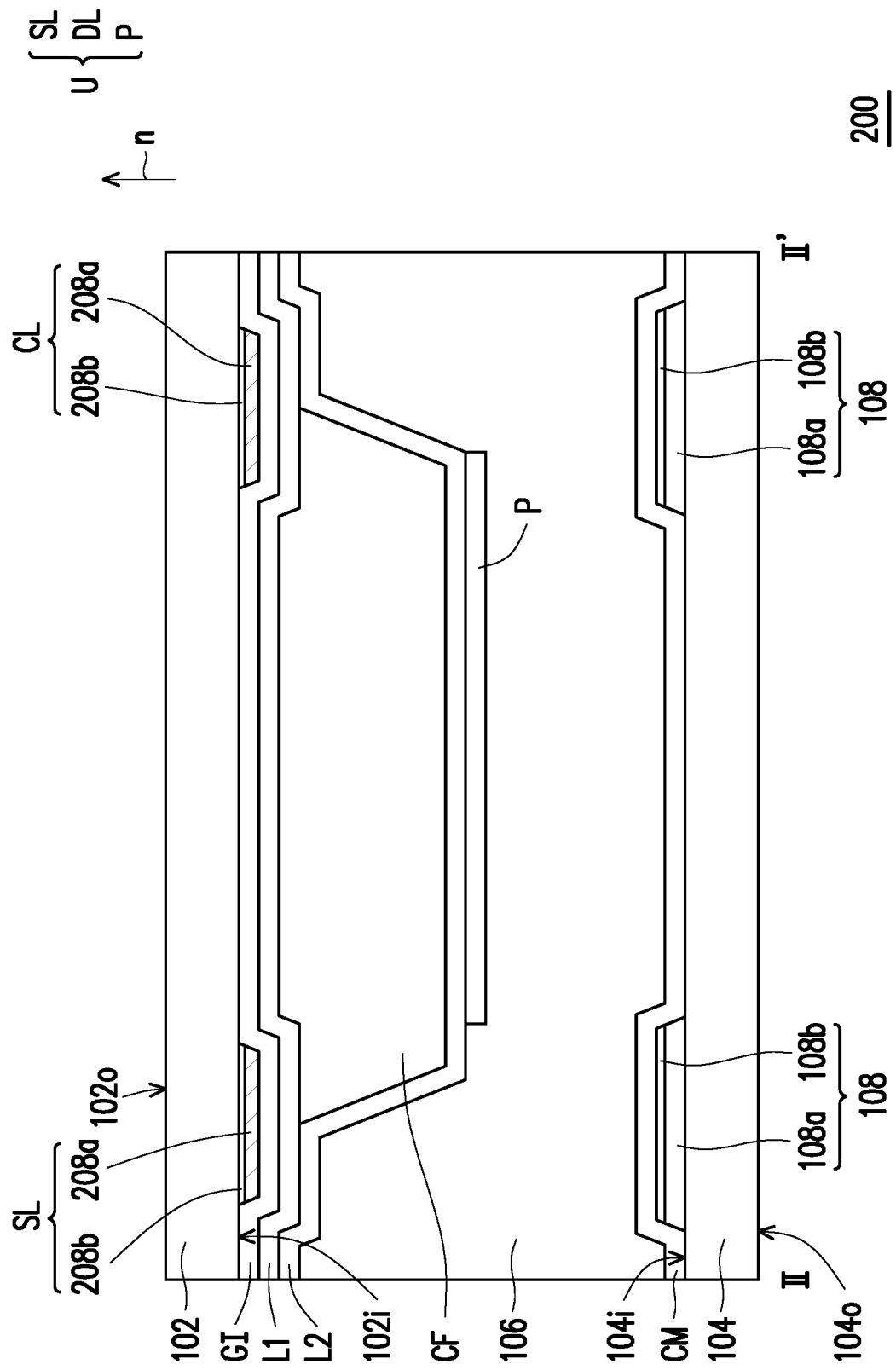
FIG. 6 is a schematic cross-sectional view of a portion of the display panel according to another embodiment of the disclosure.

FIG. 5 is a schematic cross-sectional view of a portion of a display panel according to another embodiment of the disclosure. FIG. 6 is a schematic cross-sectional view of a portion of the display panel according to another embodiment of the disclosure. Note that the cross-sectional location provided in FIG. 5 may be referred to as the location of the sectional line I-I' depicted in FIG. 2, and the cross-sectional location provided in FIG. 6 may be referred to as the location of the sectional line II-II' depicted in FIG. 2. With reference to FIG. 5-FIG. 6 and FIG. 3-FIG. 4, the display panel 200 shown in FIG. 5-FIG. 6 is similar to the display panel 100 shown in FIG. 3-FIG. 4. Therefore, the same or similar devices are denoted by the same or similar reference numerals, and the descriptions of the same technical contents are omitted. Reference may be made to the foregoing embodiments for the omitted descriptions. The difference between the two will be explained below.

With reference to FIG. 5 and FIG. 6, in the present embodiment, at least one of the scan line SL (referred to as the signal line), the common line CL (referred to as the signal line), and the gate G of the active element T respectively includes a second patterned light-shielding conductive layer 208a and a second patterned low-reflection layer 208b. Preferably, said scan line SL, said common line CL, and the gate electrode G of the active element T respectively include the second patterned light-shielding conductive layer 208a and the second patterned low-reflection layer 208b, but the disclosure is not limited thereto. The second patterned low-reflection layer 208b is located between the second patterned light-shielding conductive layer 208a and the first substrate 102. For instance, in the present embodiment, the second patterned low-reflection layer 208b and the second patterned light-shielding conductive layer 208a are sequentially stacked on the first inner surface 102i of the first substrate 102.

Besides, in the present embodiment, at least one of the data line DL (referred to as the signal line), the drain electrode D of the active element T, and the source S of the active element T may selectively include a second patterned light-shielding conductive layer 208c and a second patterned low-reflection layer 208d. Preferably, said data line DL, the drain electrode D of the active element T, and the source electrode S of the active element T respectively include the second patterned light-shielding conductive layer 208c and the second patterned low-reflection layer 208d, but the disclosure is not limited thereto. The second patterned low-reflection layer 208d is located between the second patterned light-shielding conductive layer 208c and the first substrate 102. For instance, in the present embodiment, the second patterned low-reflection layer 208d and the second patterned light-shielding conductive layer 208c are sequentially stacked on the first inner surface 102i of the first substrate 102. As provided above, at least one of said data line DL, the drain electrode D of the active element T, and the source S of the active element T may respectively include the second patterned light-shielding conductive layer 208c and the second patterned low-reflection layer 208d, and/or at least one of said scan line SL, said common line CL, and the gate electrode G of the active element T may respectively include the second patterned light-shielding conductive layer 208a and the second patterned low-reflection layer 208b.

In the present embodiment, the material of the second patterned light-shielding conductive layer 208a and the material of the second patterned light-shielding conductive layer 208c may be selected from the material of the first patterned light-shielding conductive layer 108a provided in the foregoing embodiment, and the material of at least one of the second patterned light-shielding conductive layer 208a and the second patterned light-shielding conductive layer 208c provided in the present embodiment may be substantially the same as or different from the material of the first patterned light-shielding conductive layer 108a provided in the foregoing embodiment. Besides, in the present embodiment, preferably, the optical density (unitless) of at least one of the second patterned light-shielding conductive layer 208a and the second patterned light-shielding conductive layer 208c is from about 5 to about 6.5, and thus at least one of the second patterned light-shielding conductive layer 208a and the second patterned light-shielding conductive layer 208c may have better light-shielding capability. However, the disclosure is not limited thereto. The thickness of the second patterned light-shielding conductive layer 208a and the thickness of the second patterned light-shielding conductive layer 208c provided in the embodiment may be from about 50 Å to about 10,000 Å, respectively; however, the disclosure is not limited thereto.

In the present embodiment, the material of the second patterned low-reflection layer 208b and the material of the second patterned low-reflection layer 208d may be selected from the material of the first patterned low-reflection layer 108b provided in the foregoing embodiment, and the material of at least one of the second patterned low-reflection layer 208b and the second patterned low-reflection layer 208d provided in the present embodiment may be substantially the same as or different from the material of the first patterned low-reflection layer 108b provided in the foregoing embodiment. Preferably, the reflectivity of the second patterned low-reflection layer 208b and the reflectivity of the second patterned low-reflection layer 208d may be respectively from about 2% to about 20% according to the present embodiment, but the disclosure is not limited thereto. The thickness of the second patterned low-reflection layer 208b and the thickness of the second patterned low-reflection layer 208d provided in the embodiment may be from about 50 Å to about 600 Å, respectively; however, the disclosure is not limited thereto.

As provided in the embodiments shown in FIG. 1 to FIG. 4, the light-shielding conductive pattern layer 108 is disposed between the display medium layer 106 and the second inner surface 104i, at least partially overlaps the active element T in the vertical projection direction n, and includes the first patterned low-reflection layer 108b and the first patterned light-shielding conductive layer 108a located between the first patterned low-reflection layer 108b and the second substrate 104. Thereby, the display device including the display panel 200 is capable of being used for a long time on the condition of the strong outdoor ambient light (e.g., sunlight) and can still have favorable reliability.

On the other hand, in the present embodiment, at least one of said scan line SL, said common line CL, and the gate electrode G of the active element T may respectively include the second patterned light-shielding conductive layer 208a and the second patterned low-reflection layer 208b located between the second patterned light-shielding conductive layer 208a and the first substrate 102, and/or at least one of said data line DL, the drain electrode D of the active element T, and the source electrode S of the active element T may respectively include the second patterned light-shielding conductive layer 208c and the second patterned low-reflection layer 208d located between the second patterned light-shielding conductive layer 208c and the first substrate 102, such that the second patterned low-reflection layer 208b and/or the second patterned low-reflection layer 208d may prevent the ambient light (e.g., sunlight) incident from the display surface (e.g., the first outer surface 102o) from being reflected, thereby avoiding at least one of said scan line SL, said data line DL, said common line CL, and the active element T from being seen by the user. As a result, the display device including the display panel 200 can achieve good visual effects even though the display device is not equipped with any black matrix.

Additionally, in the previous embodiments, in terms of the viewing angle from the second substrate 104 toward the first substrate 102, the active element T is the bottom-gate TFT, which should however not be construed as a limitation in the disclosure. In other embodiments, the active element T may also be a top-gate TFT, a three-dimensional TFT, or any other suitable TFT.

Figure 7:
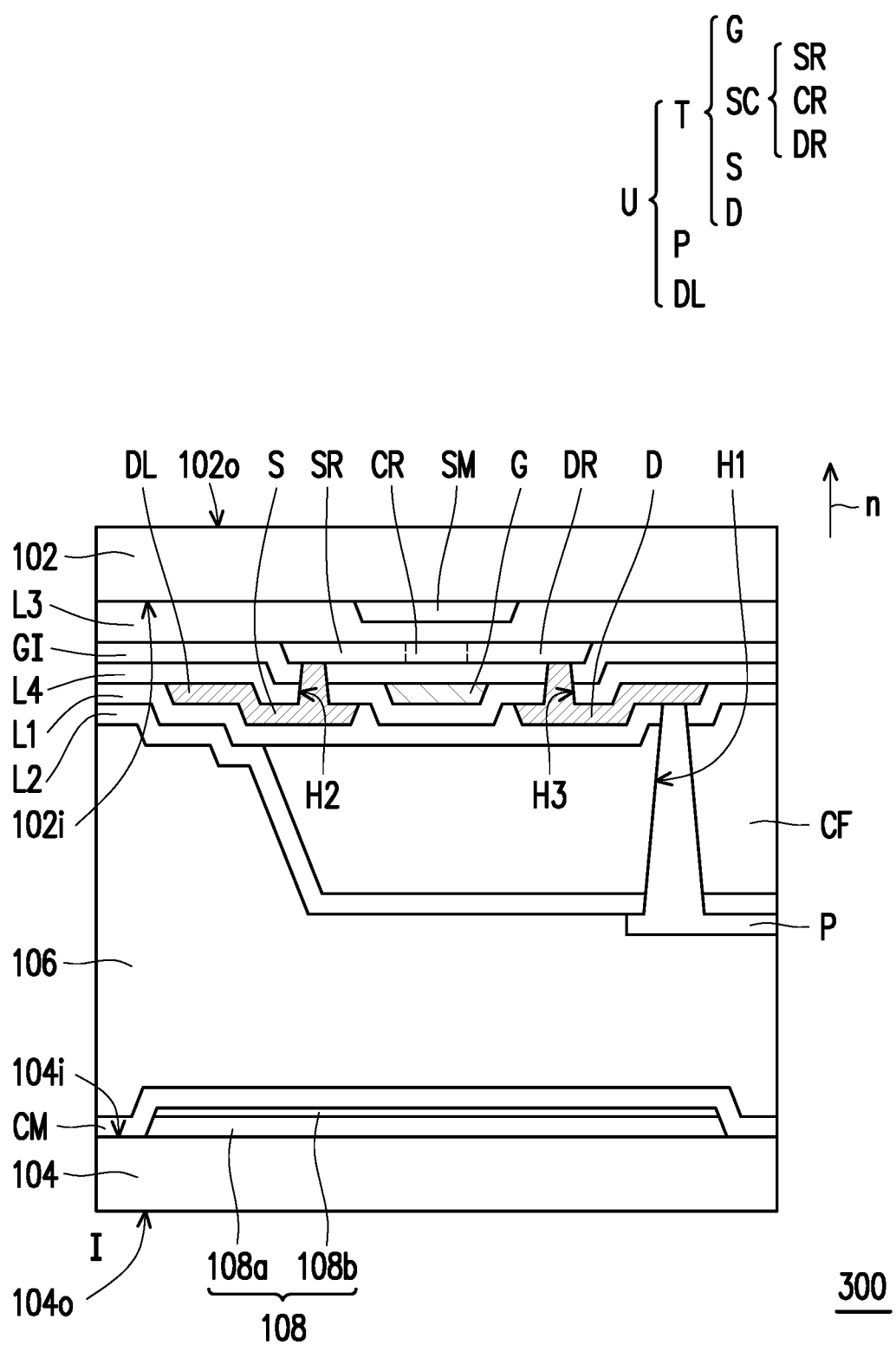
FIG. 7 is a schematic cross-sectional view of a portion of the display panel according to another embodiment of the disclosure.

FIG. 7 is a schematic cross-sectional view of a portion of the display panel according to another embodiment of the disclosure. Note that the cross-sectional location shown in FIG. 7 may be referred to as the location of the sectional line I-I' depicted in FIG. 2. With reference to FIG. 7 and FIG. 3, the display panel 300 shown in FIG. 7 is similar to the display panel 100 shown in FIG. 3. Therefore, the same or similar devices are denoted by the same or similar reference numerals, and the descriptions of the same technical contents are omitted. Reference may be made to the foregoing embodiments for the omitted descriptions. The difference between the two will be explained below.

With reference to FIG. 7, in the present embodiment, the active element T includes a gate electrode G, a semiconductor layer SC, a source electrode S and a drain electrode D. The semiconductor layer SC includes a source region SR, a drain region DR, and a channel region CR. The gate electrode G is disposed on the gate insulation layer GI, and the vertical projection of the channel region CR may be, for example, completely located within the vertical projection of the gate electrode G. The source electrode S is electrically connected to the source region SR via a contact window H2 formed in the gate insulation layer GI and an insulation layer L4 (described in detail later). The drain electrode D is electrically connected to the drain region DR via a contact window H3 formed in the gate insulation layer GI and the insulation layer L4 (described later in detail). According to the present embodiment, the material of the semiconductor layer SC includes, for example, polysilicon, an oxide semiconductor material (e.g., IGZO, zinc oxide, tin oxide, IZO, zinc-gallium oxide, ZTO, or ITO), other appropriate materials, or a combination or stack of at least two of the foregoing materials.

The display panel 300 provided in the present embodiment includes a light-shielding conductive pattern layer SM disposed between the active element T and the first inner surface 102$i$. In the present embodiment, the light-shielding conductive pattern layer SM and the channel region CR of the semiconductor layer SC are at least partially overlapped in the vertical projection direction n. In another aspect, according to this embodiment, the vertical projection of the channel region CR may be completely located within the vertical projection of the light-shielding conductive pattern layer SM, but the disclosure is not limited thereto. In the present embodiment, the light-shielding conductive pattern layer SM may be of a single-layer structure or a multi-layer structure, and the material of the light-shielding conductive pattern layer SM may include any conductive light-shielding material (e.g., molybdenum, aluminum, titanium, other suitable materials, or an alloy of the aforesaid materials), any non-conductive light-shielding material (e.g., black photoresist or other suitable materials), or other suitable materials.

The display panel 300 provided in the embodiment may include an insulation layer L3 formed entirely on the first substrate 102 and covering the light-shielding conductive pattern layer SM. The insulation layer L3 may be of a single-layer structure or a multi-layer structure and may be made of an inorganic material (e.g., silicon oxide, silicon nitride, silicon oxynitride, or other suitable materials), an organic material, or any other suitable material.

In the present embodiment, the display panel 300 may include the insulation layer L4 formed entirely on the gate insulation layer GI and covering the gate electrode G. The insulation layer L4 may be of a single-layer structure or a multi-layer structure and may be made of an inorganic material (e.g., silicon oxide, silicon nitride, silicon oxynitride, or other suitable materials), an organic material, or any other suitable material. In some embodiments, the display panel 300 may optionally not include the insulation layer L4.

As provided in the embodiments shown in FIG. 1 to FIG. 4, the light-shielding conductive pattern layer 108 is disposed between the display medium layer 106 and the second inner surface 104$i$, at least partially overlaps the active element T in the vertical projection direction n, and includes the first patterned low-reflection layer 108$b$ and the first patterned light-shielding conductive layer 108$a$ located between the first patterned low-reflection layer 108$b$ and the second substrate 104. Thereby, the display device including the display panel 300 is capable of being used for a long time on the condition of the strong outdoor ambient light (e.g., sunlight) and can still have favorable reliability.

Figure 8:
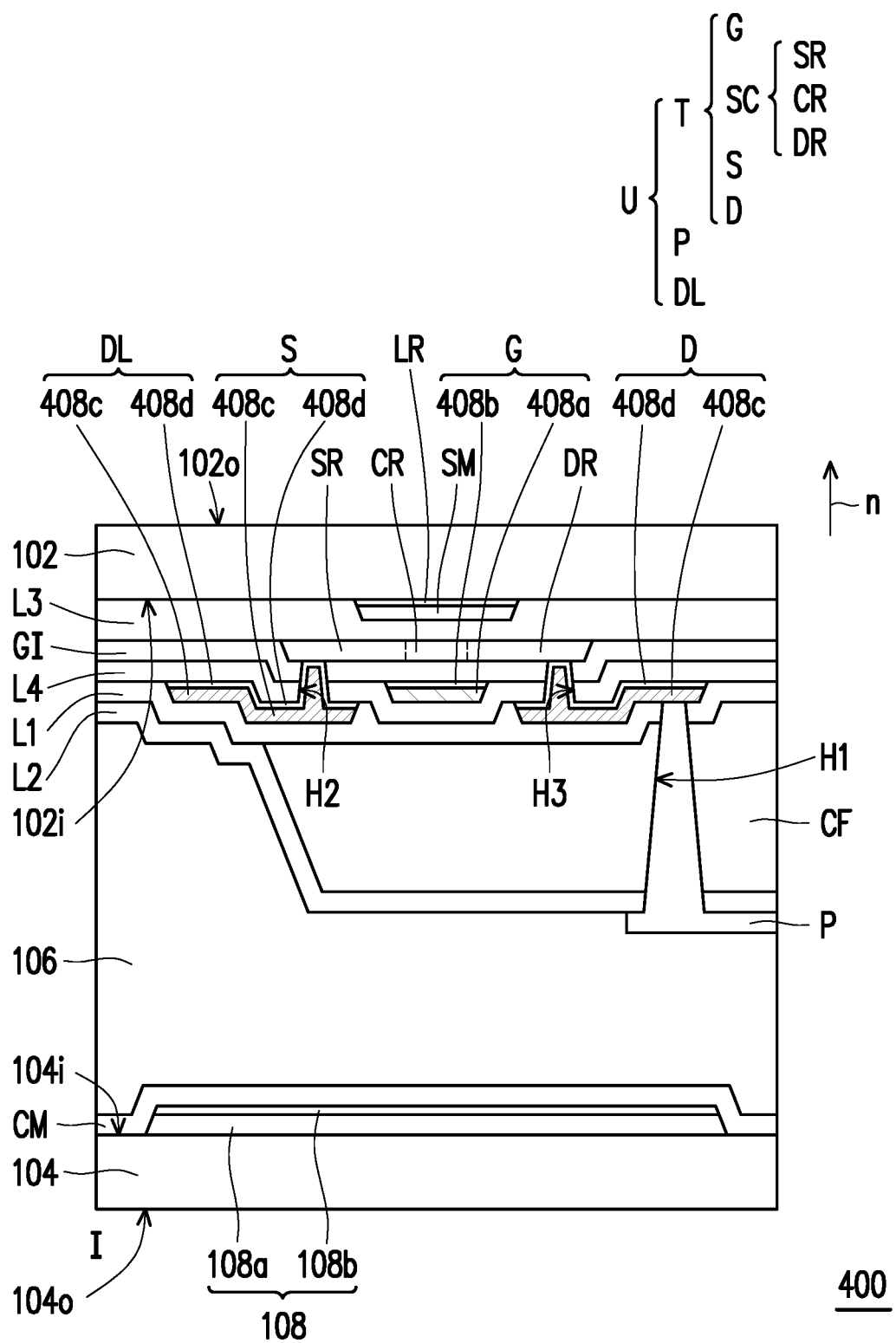
FIG. 8 is a schematic cross-sectional view of a portion of a display panel according to another embodiment of the disclosure.

FIG. 8 is a schematic cross-sectional view of a portion of a display panel according to another embodiment of the disclosure. Note that the cross-sectional location shown in FIG. 8 may be referred to as the location of the sectional line I-I' depicted in FIG. 2. With reference to FIG. 8 and FIG. 7, the display panel 400 shown in FIG. 8 is similar to the display panel 300 shown in FIG. 7. Therefore, the same or similar devices are denoted by the same or similar reference numerals, and the descriptions of the same technical contents are omitted. Reference may be made to the foregoing embodiments for the omitted descriptions. The difference between the two will be explained below.

With reference to FIG. 8, in the present embodiment, the display panel 400 includes a patterned low-reflection layer LR (or referred to as another patterned low-reflection layer), and the patterned low-reflection layer LR (or referred to as another patterned low-reflection layer) and the light-shielding conductive pattern layer SM (or referred to as another light-shielding conductive pattern layer) are stacked together. The patterned low-reflection layer LR (or referred to as another patterned low-reflection layer) is disposed between the light-shielding conductive pattern layer SM (or referred to as another light-shielding conductive pattern layer) and the first inner surface 102$i$. In the present embodiment, the patterned low-reflection layer LR and the light-shielding conductive pattern layer SM are sequentially stacked on the first substrate 102. According to the present embodiment, the material of the patterned low-reflection layer LR may be selected from the material of the first patterned low-reflection layer 108$b$ provided in the foregoing embodiment, and the material of the patterned low-reflection layer LR provided in the present embodiment may be substantially the same as or different from the material of the first patterned low-reflection layer 108$b$ provided in the foregoing embodiment. In the present embodiment, preferably, the reflectivity of the patterned low-reflection layer LR may be from about 2% to about 20%, but the disclosure is not limited thereto. Besides, as provided in the present embodiment, the thickness of the patterned low-reflection layer LR may be from about 50 Å to about 600 Å; however, the disclosure is not limited thereto.

In this embodiment, the gate electrode G of the active element T includes a second patterned light-shielding conductive layer 408$a$ and a second patterned low-reflection layer 408$b$. The second patterned low-reflection layer 408$b$ is located between the second patterned light-shielding conductive layer 408$a$ and the first substrate 102. For instance, in the present embodiment, the second patterned low-reflection layer 408$b$ and the second patterned light-shielding conductive layer 408$a$ are sequentially stacked on the first substrate 102.

Besides, in the present embodiment, at least one of the data line DL (referred to as the signal line), the drain electrode D of the active element T, and the source electrode S of the active element T may respectively include a second patterned light-shielding conductive layer 408$c$ and a second patterned low-reflection layer 408$d$, wherein the second patterned low-reflection layer 408$d$ is located between the second patterned light-shielding conductive layer 408$c$ and the first substrate 102. For instance, in the present embodiment, the second patterned low-reflection layer 408$d$ and the second patterned light-shielding conductive layer 408$c$ are sequentially stacked on the first substrate 102.

In the present embodiment, the material of the second patterned light-shielding conductive layer 408a and the material of the second patterned light-shielding conductive layer 408c may be selected from the material of the first patterned light-shielding conductive layer 108a provided in the foregoing embodiment, and the material of at least one of the second patterned light-shielding conductive layer 408a and the second patterned light-shielding conductive layer 408c provided in the present embodiment may be substantially the same as or different from the material of the first patterned light-shielding conductive layer 108a provided in the foregoing embodiment. Besides, in the present embodiment, preferably, the optical density (unitless) of at least one of the light-shielding conductive pattern layer SM (or referred to as another light-shielding conductive pattern layer), the second patterned light-shielding conductive layer 408a, and the second patterned light-shielding conductive layer 408c is from about 5 to about 6.5, and thus at least one of the light-shielding conductive pattern layer SM (or referred to as another light-shielding conductive pattern layer), the second patterned light-shielding conductive layer 408a, and the second patterned light-shielding conductive layer 408c may have better light-shielding capability. However, the disclosure is not limited thereto. The thickness of the second patterned light-shielding conductive layer 408a and the thickness of the second patterned light-shielding conductive layer 408c provided in the embodiment may be from about 50 Å to about 10,000 Å, respectively; however, the disclosure is not limited thereto.

In the present embodiment, the material of the second patterned low-reflection layer 408b and the material of the second patterned low-reflection layer 408d may be selected from the material of the first patterned low-reflection layer 108b provided in the foregoing embodiment, and the material of at least one of the second patterned low-reflection layer 408b and the second patterned low-reflection layer 408d provided in the present embodiment may be substantially the same as or different from the material of the first patterned low-reflection layer 108b provided in the foregoing embodiment. Preferably, the reflectivity of the second patterned low-reflection layer 408b and the reflectivity of the second patterned low-reflection layer 408d may be respectively from about 2% to about 20% according to the present embodiment. The thickness of the second patterned low-reflection layer 408b and the thickness of the second patterned low-reflection layer 408d provided in the embodiment may be from about 50 Å to about 600 Å, respectively.

As provided in the embodiments shown in FIG. 1 to FIG. 4, the light-shielding conductive pattern layer 108 is disposed between the display medium layer 106 and the second inner surface 104i, at least partially overlaps the active element T in the vertical projection direction n, and includes the first patterned low-reflection layer 108b and the first patterned light-shielding conductive layer 108a located between the first patterned low-reflection layer 108b and the second substrate 104. Thereby, the display device including the display panel 400 is capable of being used for a long time on the condition of the strong outdoor ambient light (e.g., sunlight) and can still have favorable reliability.

On the other hand, in the display panel 400 of the present embodiment, the patterned low-reflection layer LR and the light-shielding conductive pattern layer SM are stacked together, the patterned low-reflection layer LR is located between the light-shielding conductive pattern layer SM and the first inner surface 102i, the gate G of the active element T includes the second patterned light-shielding conductive layer 408a and the second patterned low-reflection layer 408b located between the second patterned light-shielding conductive layer 408a and the first substrate 102, and/or at least one of said data line DL, the drain D of the active element T, and the source S of the active element T may respectively include the second patterned light-shielding conductive layer 408c and the second patterned low-reflection layer 408d located between the second patterned light-shielding conductive layer 408c and the first substrate 102, such that the patterned low-reflection layer LR, the second patterned low-reflection layer 408b, and/or the second patterned low-reflection layer 408d may prevent the ambient light (e.g., sunlight) incident from the display surface (e.g., the first outer surface 102o) from being reflected, thereby avoiding at least one of said data line DL and the active element T from being seen by the user. As a result, the display device including the display panel 400 can achieve good visual effects even though the display device is not equipped with any black matrix.

In the display panel provided in the foregoing embodiments of the disclosure, the first substrate has the first inner surface and the first outer surface as the display surface of the display panel, the second substrate disposed opposite to the first substrate has the second outer surface and the second inner surface, the display medium layer is located between the first inner surface and the second inner surface, the light-shielding conductive pattern layer is disposed between the display medium layer and the second inner surface, at least one pixel unit is disposed between the display medium layer and the first inner surface and includes at least one active element, the light-shielding conductive patterned layer and the at least one active element are at least partially overlapped in the vertical projection direction, and the light-shielding conductive pattern layer includes the first patterned low-reflection layer and the first patterned light-shielding conductive layer that is located between the first patterned low-reflection layer and the second substrate. Thereby, when the display device including the display panel is used on the condition of the strong outdoor ambient light (for example, sunlight), the light-shielding conductive pattern layer may shield the light emitted by the backlight module and may prevent the reflection of the strong ambient light (e.g., sunlight) entering from the display surface. Accordingly, the active elements may be protected from being directly irradiated by the light emitted from the backlight module and being irradiated by the reflected strong ambient light (e.g., sunlight). As such, the display device provided herein can be used for a long time on the condition of the strong outdoor ambient light (e.g., sunlight) and can still have favorable reliability.

It will be apparent to those skilled in the art that various modifications and variations can be made to the structure described in the disclosure without departing from the scope or spirit of the disclosure. In view of the foregoing, it is intended that the disclosure cover modifications and variations provided they fall within the scope of the following claims and their equivalents.

What is claimed is:

1. A display panel comprising:
   a first substrate having a first inner surface and a first outer surface, the first outer surface being a display surface of the display panel;
   a second substrate disposed opposite to the first substrate and having a second inner surface and a second outer surface, wherein the second substrate is disposed below the first substrate;

a display medium layer disposed between the first inner surface of the first substrate and the second inner surface of the second substrate;

a plurality of pixel units disposed between the display medium layer and the first inner surface of the first substrate, at least one of the plurality of pixel units including at least one active element and at least one pixel electrode, the at least one pixel electrode being electrically connected to the at least one active element; and a light-shielding conductive pattern layer disposed between the display medium layer and the second inner surface of the second substrate and at least partially overlapping the active elements in a vertical projection direction, the light-shielding conductive pattern layer comprising a first patterned light-shielding conductive pattern layer and a first patterned low-reflection layer, and the first patterned light-shielding conductive pattern layer is disposed between the first patterned low-reflection layer and the second inner surface of the second substrate, wherein the first patterned low-reflection layer is near the at least one of the plurality of pixel units on the first inner surface of the first substrate, and the first patterned light-shielding conductive pattern layer is away from the at least one of the plurality of pixel units on the first inner surface of the first substrate, wherein a material of the first patterned low-reflection layer includes aluminum oxide, chromium oxide, copper oxide, molybdenum oxide, aluminum nitride, chromium nitride, copper nitride, molybdenum nitride, molybdenum tantalum alloy oxide, molybdenum titanium alloy oxide, molybdenum tantalum alloy nitride, or molybdenum titanium alloy nitride, wherein the at least one of the plurality of pixel units further comprises:

at least two signal lines disposed between the display medium layer and the first inner surface of the first substrate, wherein at least one of the at least two signal lines comprises a second patterned light-shielding conductive layer and a second patterned low-reflection layer, and the second patterned low-reflection layer is located between the second patterned light-shielding conductive layer and the first inner surface of the first substrate wherein the second patterned low-reflection layer is near the first inner surface of the first substrate, and the second patterned light-shielding conductive layer is away from the first inner surface of the first substrate, wherein a material of the second patterned low-reflection layer includes aluminum oxide, chromium oxide, copper oxide, molybdenum oxide, aluminum nitride, chromium nitride, copper nitride, molybdenum nitride, molybdenum tantalum alloy oxide, molybdenum titanium alloy oxide, molybdenum tantalum alloy nitride, or molybdenum titanium alloy nitride, and the at least one active element comprises at least one gate electrode, at least one source electrode, and at least one drain electrode, the at least one gate electrode is electrically connected to one of the at least two signal lines, the at least one source electrode is electrically connected to the other one of the at least two signal lines, and at least one of the at least one gate electrode, the at least one source electrode, and the at least one drain electrode comprises the second patterned light-shielding conductive layer and the second patterned low-reflection layer.

2. The display panel as recited in claim 1, wherein an optical density of the light-shielding conductive pattern layer is from 5 to 6.5.

3. The display panel as recited in claim 1, wherein a reflectivity of the first patterned low-reflection layer is from 2% to 20%.

4. The display panel as recited in claim 1, further comprising:

a common electrode layer disposed on the second inner surface of the second substrate and covering the light-shielding conductive pattern layer, the common electrode layer contacting a portion of the first patterned light-shielding conductive layer.

5. The display panel as recited in claim 1, wherein the light-shielding conductive patterned layer and the at least one of the at least two signal lines are at least partially overlapped in the vertical projection direction.

6. The display panel as recited in claim 1, wherein the at least one of the at least two signal lines comprises at least one data line, at least one scan line, at least one common line, or at least one power supply line.

7. The display panel as recited in claim 1, wherein a reflectivity of the second patterned low-reflection layer is from 2% to 20%.

8. A display panel comprising:

a first substrate having a first inner surface and a first outer surface, the first outer surface being a display surface of the display panel;

a second substrate disposed opposite to the first substrate and having a second inner surface and a second outer surface, wherein the second substrate is disposed below the first substrate;

a display medium layer disposed between the first inner surface of the first substrate and the second inner surface of the second substrate;

a plurality of pixel units disposed between the display medium layer and the first inner surface of the first substrate, at least one of the plurality of pixel units including at least one active element and at least one pixel electrode, the at least one pixel electrode being electrically connected to the at least one active element;

a light-shielding conductive pattern layer disposed between the display medium layer and the second inner surface of the second substrate and at least partially overlapping the active elements in a vertical projection direction, the light-shielding conductive pattern layer comprising a first patterned light-shielding conductive pattern layer and a first patterned low-reflection layer, and the first patterned light-shielding conductive pattern layer is disposed between the first patterned low-reflection layer and the second inner surface of the second substrate, wherein the first patterned low-reflection layer is near the at least one of the plurality of pixel units on the first inner surface of the first substrate, and the first patterned light-shielding conductive pattern layer is away from the at least one of the plurality of pixel units on the first inner surface of the first substrate, wherein a material of the first patterned low-reflection layer includes aluminum oxide, chromium oxide, copper oxide, molybdenum oxide, aluminum nitride, chromium nitride, copper nitride, molybdenum nitride, molybdenum tantalum alloy oxide, molybdenum titanium alloy oxide, molybdenum tantalum alloy nitride, or molybdenum titanium alloy nitride;

another light-shielding conductive patterned layer disposed between the active elements and the first inner surface and at least partially overlapping the active elements; and another patterned low-reflection layer stacked onto the another light-shielding conductive pattern layer, wherein the another patterned low-reflection layer is located between the another light-shielding conductive patterned layer and the first inner surface of the first substrate, wherein the another patterned low-reflection layer is away from the active elements, and the another light-shielding conductive patterned layer is near the active elements.

9. The display panel as recited in claim 8, wherein a reflectivity of the another patterned low-reflection layer is from 2% to 20%.

10. The display panel as recited in claim 8, further comprising at least one color conversion layer disposed between the display medium layer and the first inner surface of the first substrate or between the display medium layer and the second inner surface of the second substrate.

11. A display device comprising:
A display panel comprising:
a first substrate having a first inner surface and a first outer surface, the first outer surface being a display surface of the display panel;
a second substrate disposed opposite to the first substrate and having a second inner surface and a second outer surface, wherein the second substrate is disposed below the first substrate;
a display medium layer disposed between the first inner surface of the first substrate and the second inner surface of the second substrate;
a plurality of pixel units disposed between the display medium layer and the first inner surface of the first substrate, at least one of the plurality of pixel units including at least one active element and at least one pixel electrode, the at least one pixel electrode being electrically connected to the at least one active element; and
a light-shielding conductive pattern layer disposed between the display medium layer and the second inner surface of the second substrate and at least partially overlapping the active elements in a vertical projection direction, the light-shielding conductive pattern layer comprising a first patterned light-shielding conductive pattern layer and a first patterned low-reflection layer, and the first patterned light-shielding conductive pattern layer is disposed between the first patterned low-reflection layer and the second inner surface of the second substrate, wherein the first patterned low-reflection layer is near the at least one of the plurality of pixel units on the first inner surface of the first substrate, and the first patterned light-shielding conductive pattern layer is away from the at least one of the plurality of pixel units on the first inner surface of the first substrate, wherein a material of the first patterned low-reflection layer includes aluminum oxide, chromium oxide, copper oxide, molybdenum oxide, aluminum nitride, chromium nitride, copper nitride, molybdenum nitride, molybdenum tantalum alloy oxide, molybdenum titanium alloy oxide, molybdenum tantalum alloy nitride, or molybdenum titanium alloy nitride; and
a backlight module located at one side of the display panel, wherein the backlight module is near the second outer surface of the second substrate of the display panel and is away from first outer surface of the first substrate of the display panel.

12. The display device as recited in claim 11, wherein a brightness of the backlight module is from $7.5 \times 10^4$ nits to $15 \times 10^4$ nits.

13. A display panel comprising:
a first substrate having a first inner surface and a first outer surface, the first outer surface being a display surface of the display panel;
a second substrate disposed opposite to the first substrate and having a second inner surface and a second outer surface, wherein the second substrate is disposed below the first substrate;
a display medium layer disposed between the first inner surface of the first substrate and the second inner surface of the second substrate;
a plurality of pixel units disposed between the display medium layer and the first inner surface of the first substrate, at least one of the plurality of pixel units including at least one active element and at least one pixel electrode, the at least one pixel electrode being electrically connected to the at least one active element; and
a light-shielding conductive pattern layer disposed between the display medium layer and the second inner surface of the second substrate and at least partially overlapping the active elements in a vertical projection direction, the light-shielding conductive pattern layer comprising a first patterned light-shielding conductive pattern layer and a first patterned low-reflection layer, and the first patterned light-shielding conductive pattern layer is disposed between the first patterned low-reflection layer and the second inner surface of the second substrate, wherein the first patterned low-reflection layer is near the at least one of the plurality of pixel units on the first inner surface of the first substrate, and the first patterned light-shielding conductive pattern layer is away from the at least one of the plurality of pixel units on the first inner surface of the first substrate, wherein a material of the first patterned low-reflection layer includes aluminum oxide, chromium oxide, copper oxide, molybdenum oxide, aluminum nitride, chromium nitride, copper nitride, molybdenum nitride, molybdenum tantalum alloy oxide, molybdenum titanium alloy oxide, molybdenum tantalum alloy nitride, or molybdenum titanium alloy nitride,
wherein the at least one of the plurality of pixel units further comprises:
at least two signal lines disposed between the display medium layer and the first inner surface of the first substrate, wherein at least one of the at least two signal lines comprises a second patterned light-shielding conductive layer and a second patterned low-reflection layer, and the second patterned low-reflection layer is located between the second patterned light-shielding conductive layer and the first inner surface of the first substrate wherein the second patterned low-reflection layer is near the first inner surface of the first substrate, and the second patterned light-shielding conductive layer is away from the first inner surface of the first substrate, wherein a material of the second patterned low-reflection layer includes aluminum oxide, chromium oxide, copper oxide, molybdenum oxide, aluminum nitride, chromium nitride, copper nitride, molybdenum nitride, molybdenum tantalum alloy oxide, molybdenum titanium alloy oxide, molybdenum tantalum alloy nitride, or molybdenum titanium alloy nitride, and the second patterned low-reflection layer is face to the first patterned light-shielding conductive layer, and the second patterned low-reflection layer is not contacted with the first patterned light-shielding conductive layer.

* * * * *